(12) United States Patent
Chen et al.

(10) Patent No.: US 7,223,658 B2
(45) Date of Patent: May 29, 2007

(54) FLASH MEMORY STRUCTURE AND METHOD FOR FABRICATING THE SAME

(75) Inventors: Jason Chen, Chupei (TW); Chien Kang Kao, Hsinchu (TW)

(73) Assignee: Promos Technologies, Inc., Hsinchu (TW)

( * ) Notice: Subject to any disclaimer, the term of this patent is extended or adjusted under 35 U.S.C. 154(b) by 0 days.

(21) Appl. No.: 11/302,122

(22) Filed: Dec. 14, 2005

(65) Prior Publication Data

US 2007/0075353 A1    Apr. 5, 2007

(30) Foreign Application Priority Data

Oct. 5, 2005    (TW) .............................. 94134770 A

(51) Int. Cl.
*H01L 21/8247*    (2006.01)

(52) U.S. Cl. ...................................... 438/259; 438/954

(58) Field of Classification Search ........ 438/257–267, 438/954; 257/E21.179
See application file for complete search history.

(56) References Cited

U.S. PATENT DOCUMENTS

| | | | | |
|---|---|---|---|---|
| 4,222,062 A | * | 9/1980 | Trotter et al. ............... | 257/316 |
| 4,233,091 A | * | 11/1980 | Kawabe ....................... | 438/401 |
| 6,191,459 B1 | | 2/2001 | Hofmann et al. | |
| 6,252,272 B1 | * | 6/2001 | Watanabe et al. ........... | 257/315 |
| 6,444,545 B1 | * | 9/2002 | Sadd et al. ................. | 438/503 |
| 6,514,822 B2 | * | 2/2003 | Kim ........................... | 438/258 |
| 6,916,715 B2 | * | 7/2005 | Hsiao et al. ................ | 438/275 |
| 2004/0256662 A1 | * | 12/2004 | Black et al. ................ | 257/317 |

* cited by examiner

*Primary Examiner*—Richard A. Booth
(74) *Attorney, Agent, or Firm*—Oliff & Berridge, PLC

(57) ABSTRACT

A flash memory structure comprises a semiconductor substrate having a V-groove, a first doped region positioned in the semiconductor substrate, two second doped regions positioned in the semiconductor substrate and at two sides of the V-groove, a dielectric stack having trapping sites interposed therein positioned on the V-groove, and a conductive layer positioned on the surface of the dielectric stack above the V-groove. A method for forming the V-groove comprises steps of forming a mask layer on the surface of the semiconductor substrate, forming an opening in the mask layer, etching a portion of the semiconductor substrate below the opening to form the V-groove, and removing the mask layer. The semiconductor substrate can be a (100)-oriented silicon substrate, and the V-groove has inclined surface planes with (111) orientation.

5 Claims, 8 Drawing Sheets

US 7,223,658 B2

FLASH MEMORY STRUCTURE AND METHOD FOR FABRICATING THE SAME

BACKGROUND OF THE INVENTION (A) Field of the Invention

The present invention relates to a flash memory structure and method for fabricating the same, and more particularly, to flash memory structure having a V-groove profile and the method for fabricating the same.

(B) Description of the Related Art

Flash memory has been widely applied to the data storage of digital products such as laptop computers, digital assistants, cell phones, digital cameras, digital recorders, and MP3 players. Recently, a flash memory comprises a silicon-oxide-nitride-oxide-silicon (SONOS) structure, which is widely used in flash memory since it possesses the advantages of a thinner memory cell and a simpler fabrication process.

FIG. 1 illustrates a flash memory cell 10 with a SONOS structure according to the prior art. The flash memory cell 10 comprises a silicon substrate 12, two doped regions 14 and 16, a tunnel oxide layer 22, a silicon nitride layer 24, a silicon oxide layer 26, and a polysilicon layer 28. Particularly, the SONOS structure consists of the silicon substrate 12, tunnel oxide layer 22, the silicon nitride layer 24, the silicon oxide layer 26, and the polysilicon layer 28. While charge-trapping site in the silicon nitride layer 24 can capture electrons or holes penetrating the tunnel oxide 22, the silicon oxide layer 26 serves to prevent electrons and holes from escaping the silicon nitride layer 24 to enter into the polysilicon layer 28 during writing or erasing operations of the flash memory.

When the polysilicon layer 28, serving as the gate electrode, is charged to a positive potential, electrons in the silicon substrate 12 will inject into the silicon nitride layer 24. Inversely, a portion of electrons in the silicon nitride layer 24 will be repulsed to inject into the silicon substrate 12 to form holes in the silicon nitride layer 24 when the polysilicon layer 28 is charged to a negative potential. Electrons and holes trapped in the silicon nitride layer 24 change the threshold voltage ($V_{th}$) of the flash memory cell 10, and different threshold voltages represent that the flash memory stores different data bits, i.e., "1" and "0".

SUMMARY OF THE INVENTION

The objective of the present invention is to provide a flash memory structure having a V-groove profile and the method for fabricating the same, which possesses a higher storage density and better step coverage property.

In order to achieve the above-mentioned objective, one embodiment of the present invention discloses a flash memory structure comprising a semiconductor substrate having a V-groove, a first doped region positioned in the semiconductor substrate and below the V-groove, two second doped regions positioned in the semiconductor substrate and at two sides of the V-groove, a dielectric stack having a plurality of trapping sites positioned at least on the surface of the V-groove, and a conductive layer positioned on the surface of the dielectric stack and above the V-groove. The semiconductor substrate can be a (100)-oriented silicon substrate, and the V-groove has inclined surface planes with (111) orientation.

One embodiment of the dielectric stack comprises a first oxide layer positioned on the surface of the semiconductor substrate, a nitride layer positioned on the surface of the first oxide layer, and a second oxide layer positioned on the surface of the nitride layer, wherein the trapping sites are generated from the nitride layer. Another embodiment of the dielectric stack comprises a first oxide layer positioned on the surface of the semiconductor substrate, a first nitride layer positioned on the surface of the first oxide layer, a silicon-containing layer made of polysilicon or silicon germanium positioned on the surface of the first nitride layer, a second nitride layer positioned on the surface of the silicon-containing layer, and a second oxide layer positioned on the surface of the second nitride layer, wherein the trapping sites are generated from the silicon-containing layer. A further embodiment of the dielectric stack comprises an oxide layer positioned on the surface of the semiconductor substrate, a nitride layer optionally positioned on the surface of the oxide layer, a plurality of nanocrystals serving as the trapping sites positioned on the surface of the nitride layer, and a cover layer made of silicon oxide or silicon nitride positioned on the surface of the nitride layer, wherein the nanocrystal is made of silicon, silicon germanium, metal, alloy of metal, or silcide.

The method for preparing a flash memory structure comprises steps of forming a first doped region in a semiconductor substrate, forming a V-groove in the semiconductor substrate and above the first doped region, forming two second doped regions in the semiconductor substrate and at two sides of the V-groove, forming a dielectric stack having a plurality of trapping sites on the V-groove, and forming a conductive layer on the surface of the dielectric stack. The step of forming a V-groove comprises forming a mask layer on the surface of the semiconductor substrate, forming an opening in the mask layer, performing an etching process to remove a portion of the semiconductor substrate below the opening to form the V-groove, and removing the mask layer. Preferably, the mask layer is an oxide layer, and the etching process uses an etchant including potassium hydroxide. The semiconductor substrate can be a (100)-oriented silicon substrate, and the V-groove has inclined surface planes with (111) orientation.

Compared to the prior art, the present flash memory structure possesses a higher storage density and the method for fabricating the flash memory possesses a better step coverage property. The present flash memory structure has two memory cells, which share the same gate electrode and the same drain electrode. In addition, these two memory cells have carrier channels positioned in the semiconductor substrate below the two inclined surfaces of the V-groove, and trapping sites positioned in the dielectric stack on the inclined surface of the V-groove in an inclined manner rather than in a horizontal manner as in the prior art. Consequently, the present invention can increase the number of memory cells in a unit substrate area, i.e., increasing the storage density. Further, the width of the V-groove is larger at the top region than at the bottom region, and the dielectric stack and the conductive layer can be prepared by deposition process with a better step coverage property, which will not form a void in the dielectric stack or in the conductive layer.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 1:
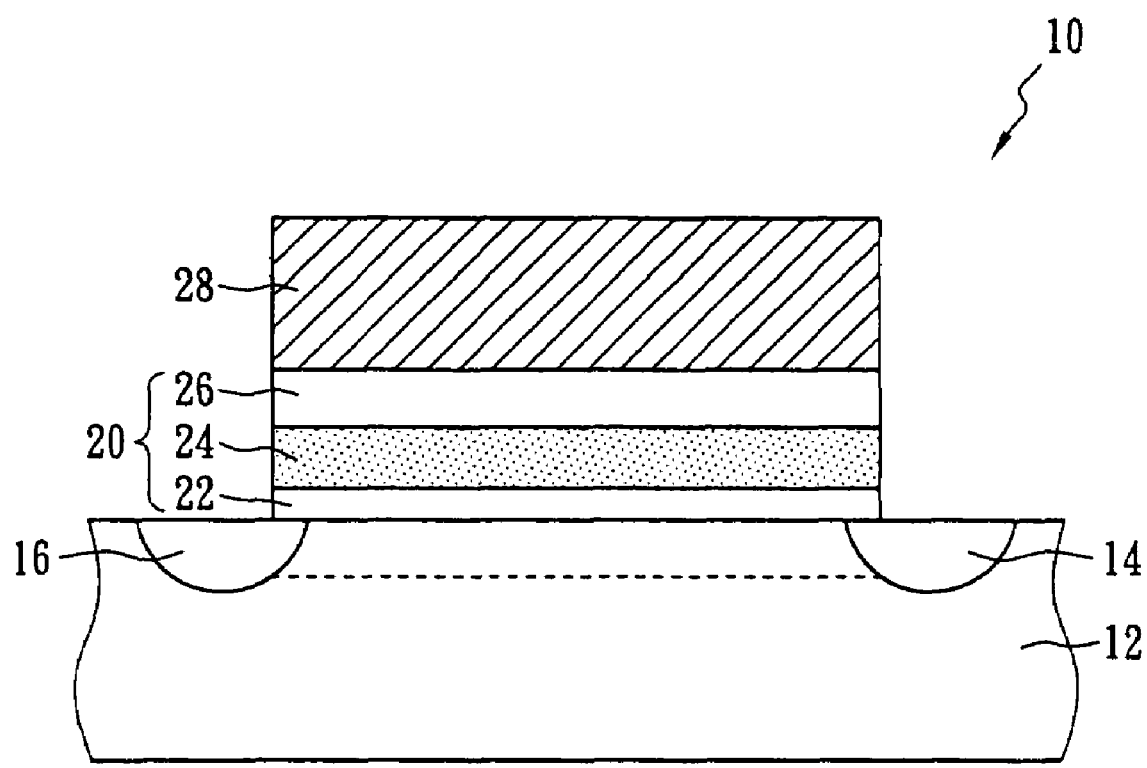
FIG. 1 illustrates a flash memory cell with a SONOS structure according to the prior art.
Figure 2:
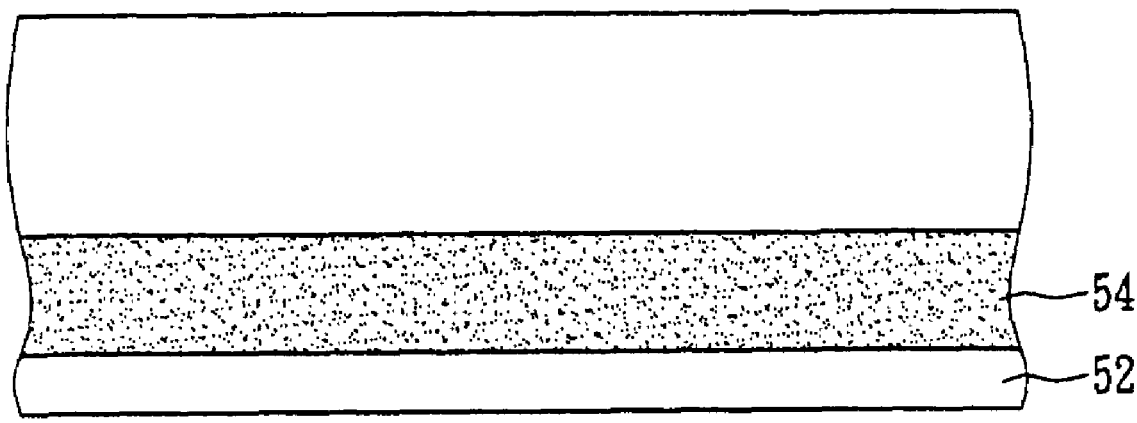
FIG. 2 to FIG. 7 illustrate a method for fabricating a flash memory structure according to one embodiment of the present invention.
Figure 3:
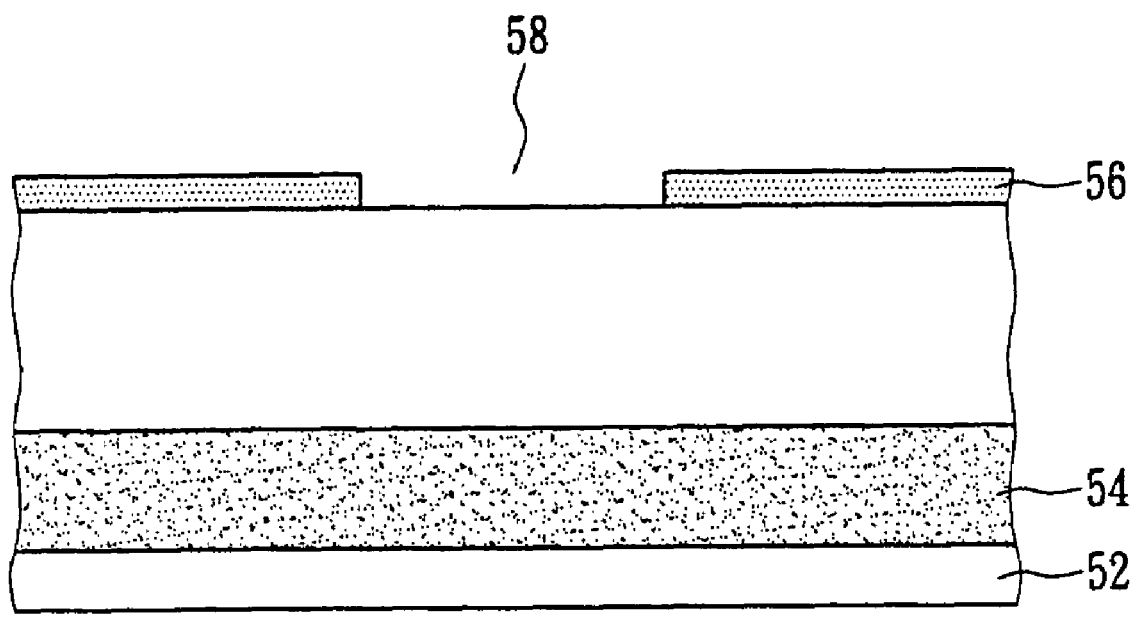

FIG. 2 to FIG. 7 illustrate a method for fabricating a flash memory structure 50 according to one embodiment of the present invention. A first doped region 54 is formed in a silicon substrate 52 by an n+ ion implanting process, and the implanting energy is preferably between 20 and 30 keV to implant dopants into a depth between 1600 and 2000 angstroms. A mask layer 56 is formed on the surface of the silicon substrate 52, and a lithographic process is then performed to form an opening 58 in the mask layer 56, as shown in FIG. 3. Preferably, the mask layer 56 is a silicon oxide layer, and the silicon substrate 52 is (100)-oriented.

Figure 4:
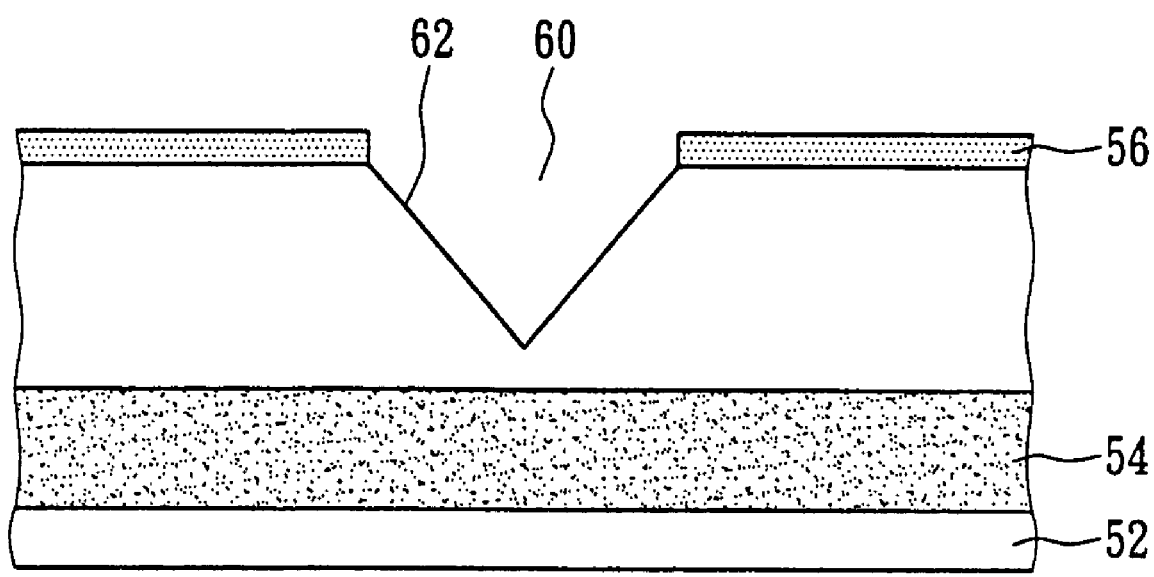

Referring to FIG. 4, an etching process is performed to remove a portion of the silicon substrate 52 below the opening 58 to form a V-groove 60, and the mask layer 56 is then completely removed. Particularly, the etching process uses an etchant including potassium hydroxide, and the V-groove 60 has inclined surface planes 62 with (111) orientation. The etchant removes the silicon substrate 52 at a rate of 0.6 micrometer/minute along the planes with (100) orientation and at a rate of 0.006 micrometer/minute along the planes with (111) orientation at 80° C., i.e., the etching process is orientation-independent, which can form the V-groove 60 with the inclined surface planes 62 with (111) orientation automatically.

Figure 5A:
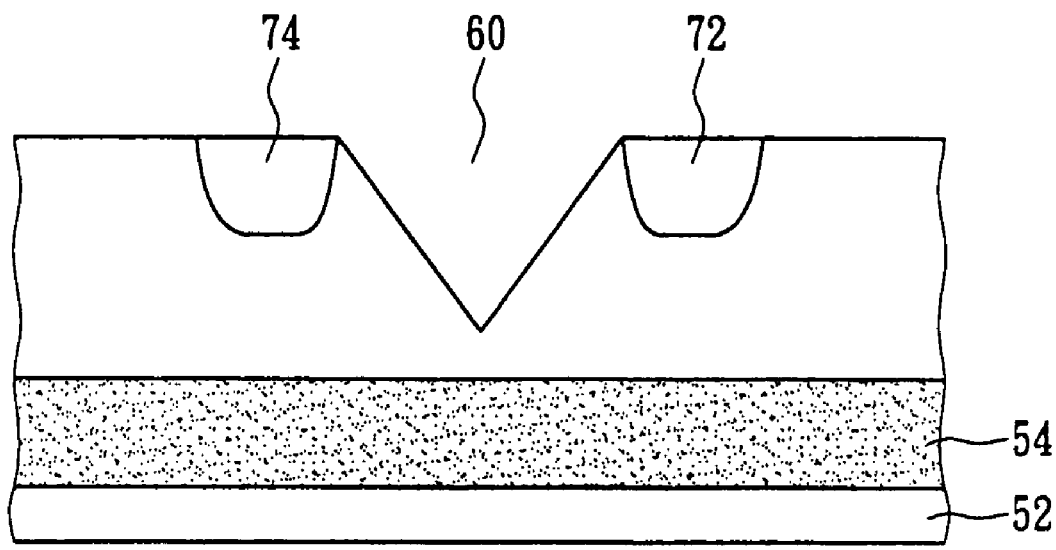
Figure 5B:
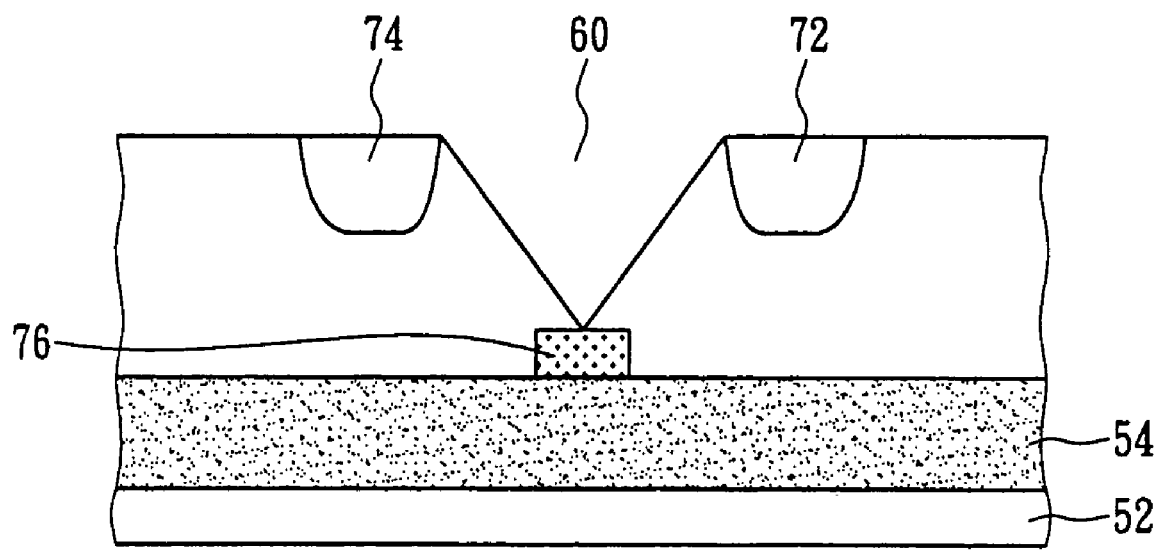

Referring to FIG. 5(a), another n+ ion implanting process is performed to form two second doped regions 72 and 74 in the silicon substrate 52 and at two sides of the V-groove 60. A third doped region 76 can be optionally formed between the two second doped regions 72 and 74 in the silicon substrate 52 by an n+ or n− ion implanting process, and the third doped region 76 is positioned above the first doped region 54 but below the V-groove 60 to guide induced current, as shown in FIG. 5(b). Particularly, the first doped region 54 serves as the drain electrode of a transistor, and the second doped regions 72 and 74 serve as the source electrode of the transistor.

Figure 6:
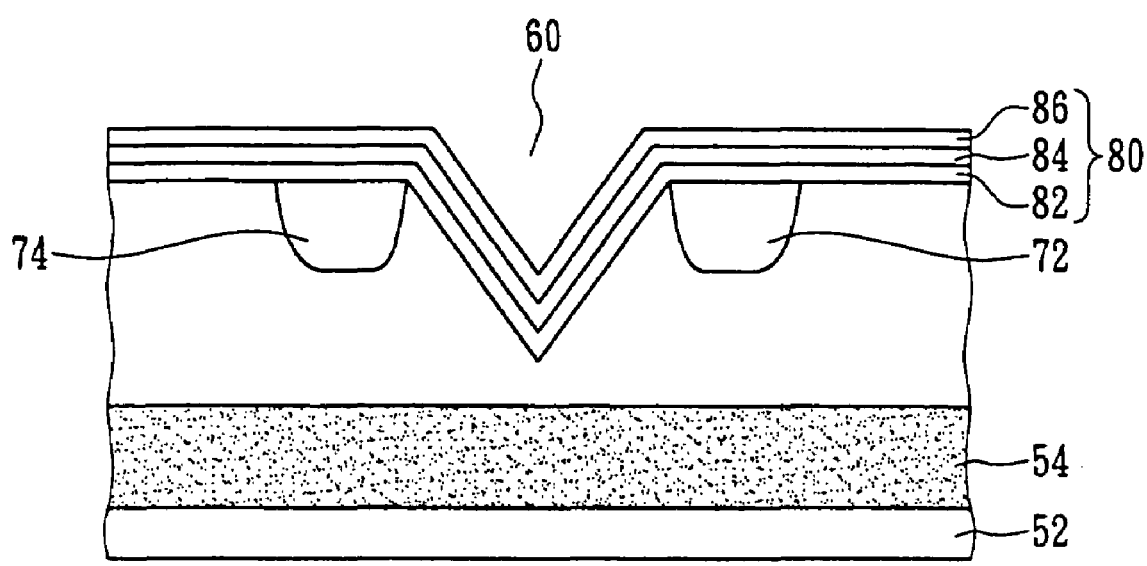
Figure 7:
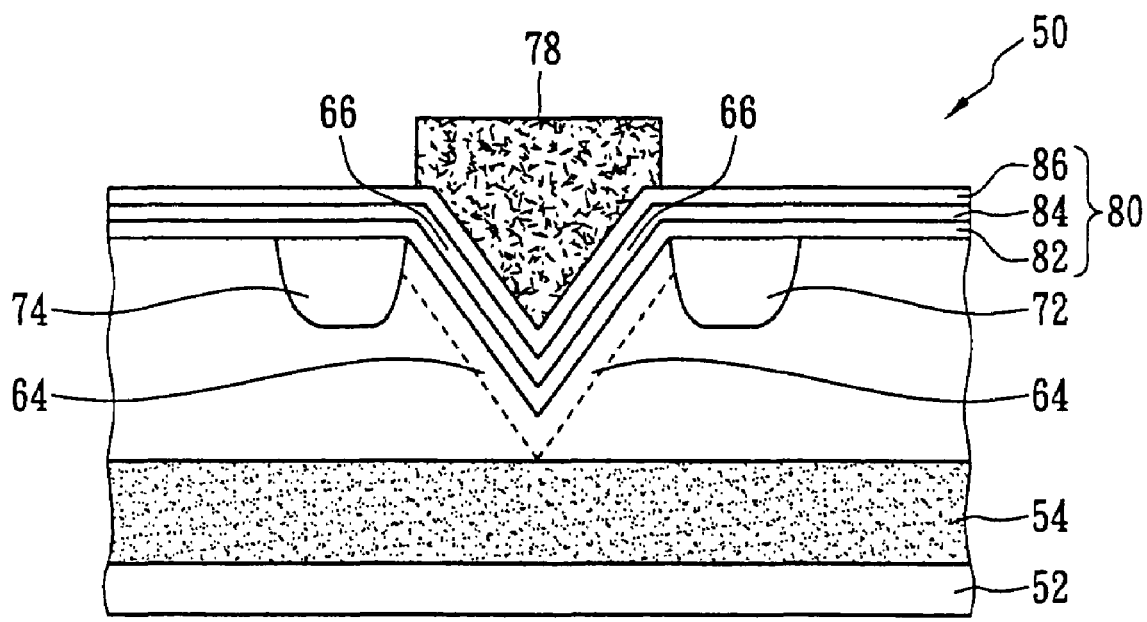

Referring to FIG. 6, deposition processes are performed to form a first oxide layer 82 on the surface of the silicon substrate 52, a silicon nitride layer 84 on the surface of the first oxide layer 82, and a second oxide layer 86 on the surface of the silicon nitride layer 84 so as to form a dielectric stack 80 on the surface of the silicon substrate 52. A conductive layer 78 made of polysilicon is subsequently formed on the surface of the dielectric stack 80 and above the V-groove 60 to complete the flash memory structure 50. Particularly, the flash memory structure 50 includes a plurality of carrier trapping sites 66 disposed in the silicon nitride layer 84 of the dielectric stack 80 on the two inclined surface planes 62 of the V-groove 60.

Figure 8:
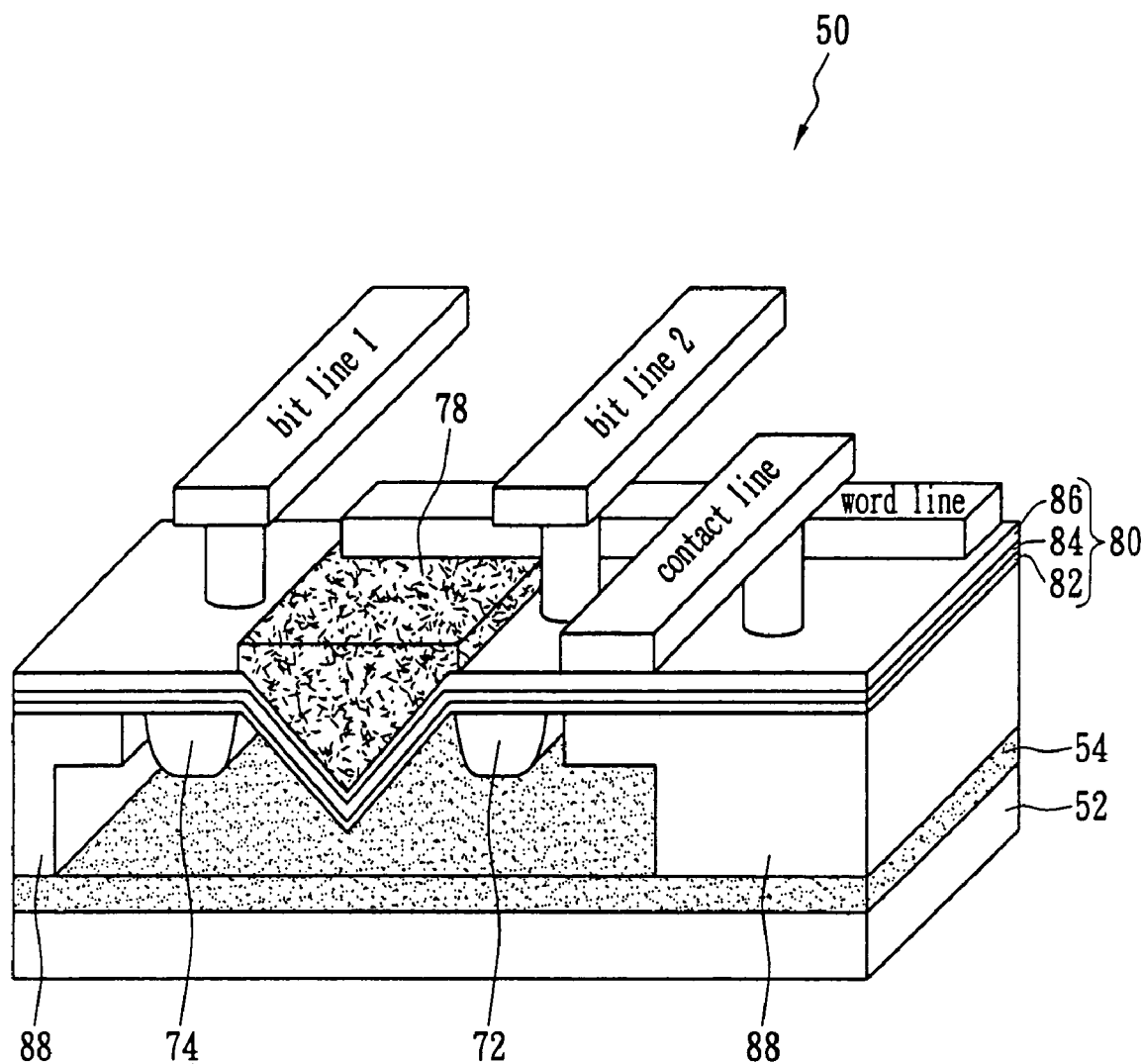
FIG. 8 is a three-dimensional diagram of the flash memory structure according to one embodiment of the present invention.
Figure 9:
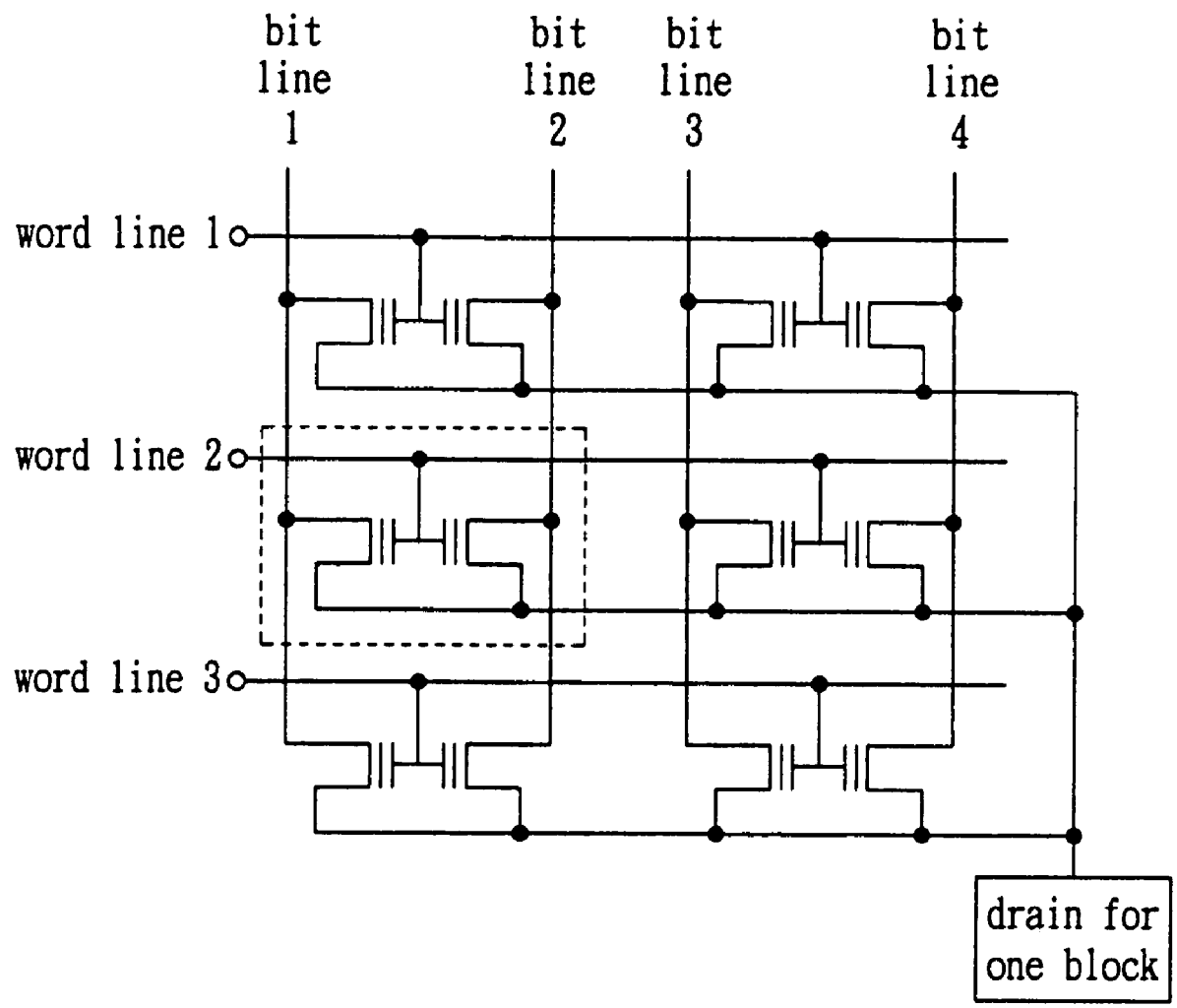
FIG. 9 illustrates a NOR flash memory designed in view of the flash memory structure according to one embodiment of the present invention.

FIG. 8 is a three-dimensional diagram of the flash memory structure 50 according to one embodiment of the present invention, wherein a portion of the silicon substrate 52 is not shown for clarity consideration. FIG. 9 illustrates a NOR flash memory designed in view of the flash memory structure 50 according to one embodiment of the present invention. The flash memory structure 50 in FIG. 8 comprises two SONOS flash memory cells, which correspond to a dash-lined region in FIG. 9. These two SONOS flash memory cells share the same drain electrode (the first doped region 54) and gate electrode (the conductive layer 78), and the carrier channels of the two SONOS flash memory cells are positioned in the silicon substrate 52 and below the two inclined surface planes 62 of the V-groove 60 in an inclined manner. Particularly, the flash memory structure 50 in FIG. 8 directly corresponds to the circuit design of the NOR flash memory in FIG. 9. The bit line 1 connects to the second doped region 74, and bit line 2 connects to the second doped region 72, wherein the two second doped regions 72 and 74 serve as the two source electrodes of the two SONOS flash memory cells, respectively. The contact line penetrates a dielectric layer 88 to connect to the first doped region 54, and one end of the contact line is connected to a drain electrode for one block.

Compared to the prior art, the present flash memory structure possesses a higher storage density and the method for fabricating the flash memory possesses a better step coverage property. The present flash memory structure has two memory cells, which share use of the same gate electrode and drain electrode. In addition, these two memory cells have carrier channels positioned in the semiconductor substrate below the two inclined surfaces of the V-groove, and trapping sites positioned in the dielectric stack on the inclined surface of the V-groove in an inclined manner rather than in a horizontal manner as in the prior art. Consequently, the present invention can increase the number of memory cells in a unit silicon area, i.e., increasing the storage density. Further, the width of the V-groove is larger at the top region than that at the bottom region, and the dielectric stack and the conductive layer can be prepared by deposition process with a better step coverage property, which will not form a void in the dielectric stack or in the conductive layer.

Figure 10:
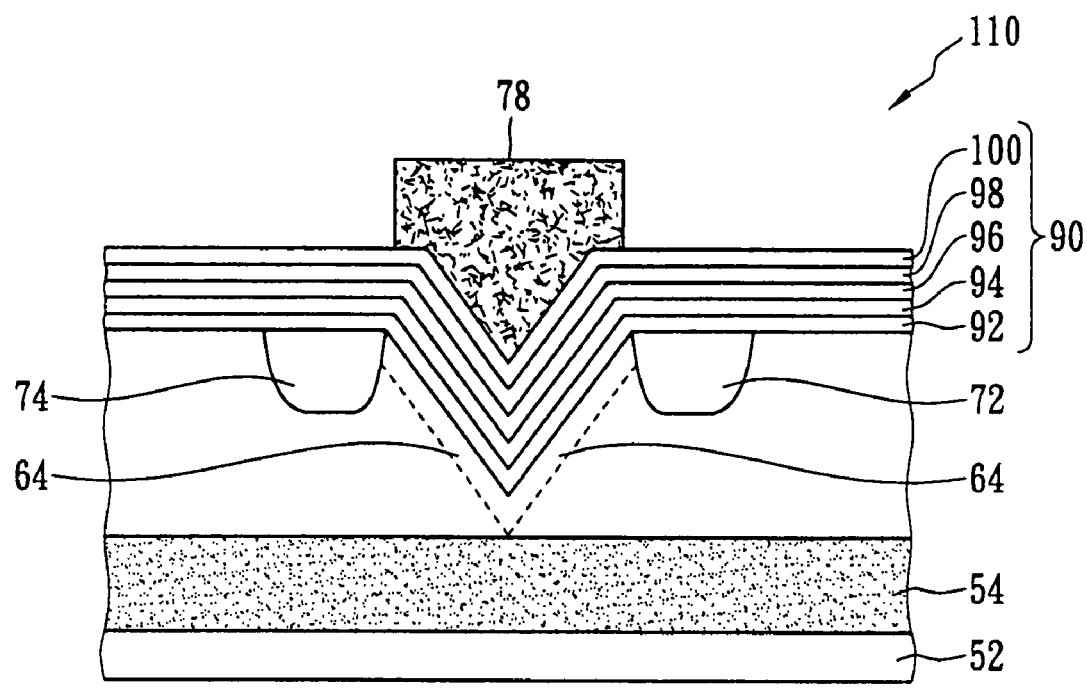
FIG. 10 illustrates a flash memory structure according to another embodiment of the present invention.

In addition, the application of the present invention is not limited to the SONOS flash memory as describe above. FIG. 10 illustrates a flash memory structure 110 having a dielectric stack 90 according to another embodiment of the present invention. The dielectric stack 90 can be prepared by steps of forming a first oxide layer 92 on the surface of the silicon substrate 52, forming a first silicon nitride layer 94 on the surface of the first oxide layer 92, forming a silicon-containing layer 96 made of polysilicon or silicon germanium on the surface of the first silicon nitride layer 94, forming a second silicon nitride layer 98 on the surface of the silicon-containing layer 96, and forming a second oxide layer 100 on the surface of the second silicon nitride layer 98. Particularly, the carrier trapping sites are positioned in the silicon-containing layer 96.

Figure 11:
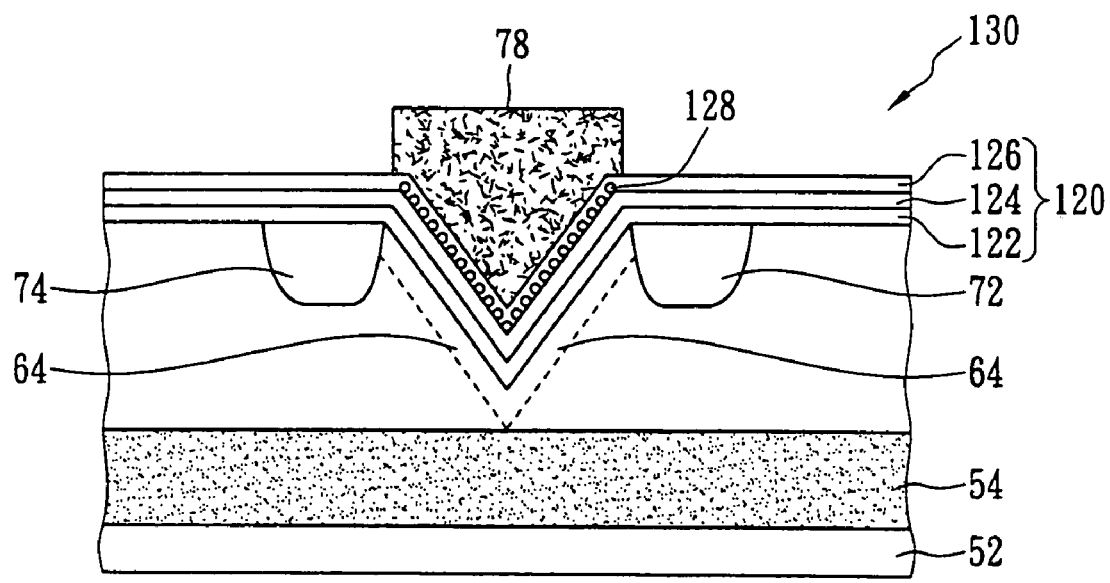
FIG. 11 illustrates a flash memory structure according to another embodiment of the present invention.

FIG. 11 illustrates a flash memory structure 130 including a dielectric stack 120 having a plurality of carrier trapping sites disposed therein according to another embodiment of the present invention. The dielectric stack 120 can be prepared by forming an oxide layer 122 on the surface of the silicon substrate 52, forming a silicon nitride layer 124 on the surface of the oxide layer 122, forming a plurality of nanocrystals 128 serving as the trapping sites on the surface of the silicon nitride layer 124, and forming a cover layer 126 made of silicon oxide or silicon nitride covering the nanocrystals 128 and the silicon nitride layer 124. Particularly, the nanocrystals 128 are made of semiconductor material, metal, alloy of metal, or silcide, wherein the metal can be cobalt, nickel or tungsten, and the semiconductor material can be silicon or silicon germanium.

The above-described embodiments of the present invention are intended to be illustrative only. Numerous alternative embodiments may be devised by those skilled in the art without departing from the scope of the following claims.

What is claimed is:

1. A method for fabricating a flash memory structure, comprising steps of:
   forming a first doped region in a semiconductor substrate;
   forming a V-groove in the semiconductor substrate and above the first doped region;
   forming two second doped regions in the semiconductor substrate and at two sides of the V-groove;
   forming a dielectric stack having a plurality of trapping sites on the surface of the V-groove including the steps of:
      forming a first oxide layer on the surface of the semiconductor substrate;
      forming a first nitride layer on the surface of the first oxide layer;
      forming a silicon-containing layer made of polysilicon or silicon germanium on the surface of the first nitride layer;
      forming a second nitride layer on the surface of the silicon-containing layer; and
      forming a second oxide layer on the surface of the second nitride layer; and
   forming a conductive layer on the surface of the dielectric stack and above the V-groove.

2. The method for fabricating a flash memory structure of claim 1, wherein the step of forming a V-groove comprises:
   forming a mask layer on the surface of the semiconductor substrate;
   forming an opening in the mask layer;
   performing an etching process to remove a portion of the semiconductor substrate below the opening to form the V-groove; and
   removing the mask layer.

3. The method for fabricating a flash memory structure of claim 2, wherein the etching process uses an etchant including potassium hydroxide.

4. The method for fabricating a flash memory structure of claim 2, wherein the semiconductor substrate is a (100)-oriented silicon substrate, and the V-groove has inclined surface planes with (111) orientation.

5. The method for fabricating a flash memory structure of claim 2, wherein the mask layer is an oxide layer.

* * * * *